United States Patent [19]

Stahr et al.

[11] 3,710,203

[45] Jan. 9, 1973

[54] HIGH POWER STORAGE DIODE

[75] Inventors: Donald F. Stahr, Johnstown; Kirby D. Dorwachter, Monroeville, both of Pa.

[73] Assignee: FMC Corporation, San Jose, Calif.

[22] Filed: Nov. 5, 1971

[21] Appl. No.: 196,078

[52] U.S. Cl...317/234 R, 317/235 AD, 317/235 AQ, 307/300, 148/186

[51] Int. Cl. ................................................ H01l 3/00

[58] Field of Search.....317/234 U, 235 AD, 235 AQ, 317/235 K; 307/300; 148/186

[56] References Cited

UNITED STATES PATENTS

| | | | |
|---|---|---|---|
| 2,790,940 | 4/1957 | Prince | 148/186 |
| 3,465,176 | 9/1969 | Tanaka et al. | 317/235 |

OTHER PUBLICATIONS

Solid State Electronics, "Determination of the Lifetime from the Stored Carrier Charge in Diffused PSN Rectifiers" by Schuster, pp. 427–430, 1965.

*Primary Examiner*—Jerry D. Craig
*Attorney*—F. W. Anderson et al.

[57] ABSTRACT

A high power storage silicon diode of the type having a lightly doped P-type base region or central layer of approximately 100 microns or more in width with a resistivity of about 90 ohm-centimeters and with one heavily doped end layer of N-type material and with another heavily doped end layer of P-type material. The boron in the P-type layer should have an average concentration of at least $2 \times 10^{20}$ atoms/cm.$^3$ while the phosphorous in the N-type layer should have an average concentration of from $2 - 5 \times 10^{20}$ atoms/cm.$^3$. Atoms of nickel can be diffused into the space charge region of the diode in small quantities to further extend the storage time without degrading the other useful qualities of the device.

8 Claims, 2 Drawing Figures

INVENTORS.
DONALD F. STAHR
KIRBY D. DORWACHTER
BY C. E. Triggs
R. S. Kelly
ATTORNEYS

HIGH POWER STORAGE DIODE

BACKGROUND OF THE INVENTION

1. Field of the Invention

The present invention pertains to silicon rectifying devices and to the processes for producing the same, and more particularly, it pertains to a high power silicon diode of the *p-s-n* type having a relatively large reverse current storage phase followed by a rapid recovery to the reverse blocking state.

2. Description of the Prior Art

The switching processes in silicon diodes from the forward to the reverse current state have been subject to investigation for many years. In many instances it is desirable to reduce to a minimum the reverse current which is caused by the presence of minority carriers in the space charge region of the device which require a finite time to be swept therefrom. However, in certain instances it has been found desirable to extend the recovery time of the diode to some finite carefully controlled time. At the end of this time (the storage phase) the diode should almost instantaneously snap into its blocking state (the fast recovery phase). For example, low power step recovery diodes have been on the market for several years and have been used extensively in the microwave field for high order harmonic generation applications. The design theory for these low injection level charge-storage diodes is well known. The length of the storage phase is directly proportional to the minority carrier lifetime and the magnitude of the stored charge as determined by the magnitude and time of the forward current. The minority carrier lifetime, in turn, depends upon the diode area, the impurity profile, the temperature, the injection level and the recombination trap density. The duration of the fast recovery phase is primarily dependent upon the impurity profile, the magnitude of the stored charge, and the parameters of the external circuitry. A steep impurity gradient at the *pn* junction will result in a short recovery phase. Long recovery phases result from a large amount of stored charge.

With high power devices or high level injection charge-storage devices, however, it has been recognized that a different set of factors must be taken into consideration. The theories involved in the reverse recovery processes of high power silicon rectifiers have been discussed at length by Hansjochen Benda and Eberhard Spenke in the Proceedings of the IEEE, Volume 55, No. 8, published in August, 1967. It was there theorized that the sweeping out of the minority carriers during the reverse recovery process in the diode takes place uniformly from the two sides of the base layer owing to the nearly uniform concentration distribution of carriers when the diode is in the forward conducting state. Because of the unequal electron and hole mobilities, the impurity distribution on the side of the *p*-contact is of much greater importance than it is at the *n*-contact side. Thus, if there is no *pn* junction on this more important side of the diode, then the stored charge can be swept out without much voltage build-up. It has therefore been theorized that a rectifier having a lightly doped base region of *p*-type material is preferred over the diodes having a base region of *n*-type material since this should place the pn junction on the *p*-contact side of the device. The problem then, according to the prior art thinking, was one of varying the base width of the diode and the area thereof in order to directly affect the length of the storage time and the other useful characteristics thereof.

SUMMARY OF THE INVENTION

By the present invention a high power storage diode is provided which can handle large currents in excess of 200 amps in the forward direction and which have large reverse currents of from 50 to 100 amps for storage times of from 3 to 6 microseconds depending upon the area of the device. The high power storage diodes are also characterized by step, or snap, recovery, i.e., a recovery time from maximum reverse current conduction to a blocking state in less than one-tenth of a microsecond. Such power diodes are also characterized by a uniform reverse current conduction wherein the differential between the maximum reverse current and the current just prior to snap recovery (otherwise known as "droop") comprises not more than a 10 or 20 % of the maximum reverse current. Such high power storage diodes have proved to be particularly useful as pulse modulators with high peak power capabilities.

It has been found that the prior art theories on reverse current conduction in high power storage diodes did not take into consideration fully the effects of varying the concentration levels of the boron and phosphorous dopant impurities in the *n*-type and *p*-type end layers of the diode. It has been found that by heavily doping these layers the useful characteristics of the high power storage diode are greatly enhanced. For example, it has been discovered that an average boron atom concentration in the heavily doped *p*-type layer should be at least $2 \times 10^{20}$ atoms per cubic centimeter, and that this concentration level will have a direct effect upon the reverse recovery time. In the *n*-type layer of the diode, the phosphorous concentration should be between approximately $2 \times 10^{20}$ and $5 \times 10^{20}$ atoms per cubic centimeter which is the ideal range for both maximizing the storage time and minimizing the droop in the storage phase.

It has also been found that the diffusion of nickel into the space charge region of the diode can contribute to the useful characteristics of the storage device by increasing minority carrier lifetime and thereby increasing the storage time without significantly degrading the other useful electrical characteristics of the device.

DESCRIPTION OF THE PREFERRED EMBODIMENT

In the design of the high power storage diode of the present invention different parameters of the basic diffused diode structure were evaluated against the design objectives of producing a high power device capable of carrying high forward currents of from 5 to 250 amps with reverse voltage ratings of from 25 to 1,500 volts. The term "storage diode" is applied here to designate a class of diodes which, after switching from a forward current condition to a reverse current condition, have a finite controlled storage phase followed by a very abrupt transition from reverse conduction to cutoff. During this reverse recovery process, the current vs. time characteristic of these diodes can be made to closely approximate a step function. It is important that the reverse current remain substantially uniform during the storage phase and that the transition to cutoff, or the reverse blocking condition of the diode, be made in a minimum period of time. It is also important that the storage phase be as long as possible without unduly increasing the forward voltage drop.

Figure 1:
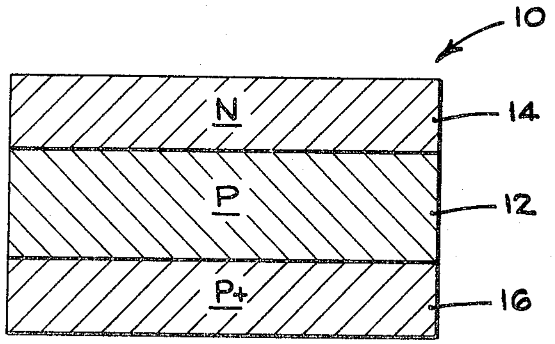
FIG. 1 is a cross sectional view of a conventional *n-p-p+* diode to which the process of the present invention is applied.

As indicated by the prior art, a silicon diode of the $p$-$s_p$-$n$ (or N-P-P+) type is most likely to produce a good high power storage diode. Such a diode, as shown in FIG. 1, comprises a silicon body 10 having an intrinsic or very lightly doped base region 12 of P-type conductivity, a more heavily doped end region 16 of P-type conductivity, and an opposite end region 14 of N-type conductivity. As is conventional, such diodes are formed from a silicon body of P-type material with a doping of around $1 \times 10^{14}$ atoms per cubic centimeter. This body is then subjected to a double diffusion process wherein phosphorous is first diffused into one end surface to a controlled depth to form the N layer 14, and boron is then diffused into the opposite end surface to a controlled depth to form the P+ layer 16. The base region 12 then comprises the central layer which extends between the outer highly doped layers of the diode.

It has been found that the crystal resistivity of the starting silicon material, while essentially irrelevant as far as the reverse storage time and recovery time are concerned, is important in fixing the avalanche voltage or maximum reverse voltage that the diode can handle. If a reverse voltage rating of 1,000 volts or better is required, then the starting crystal resistivity should be 100 ohm centimeters or more. It has further been determined that crystalline perfection is not a critical parameter in determining the storage diode characteristics and, hence, any of many readily available types of silicon material may be utilized.

Figure 2:
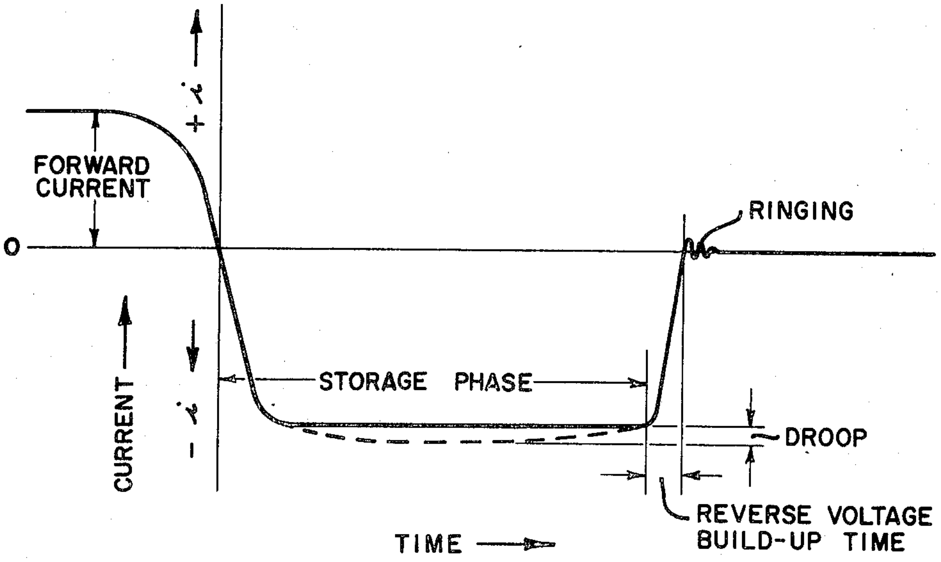
FIG. 2 is a schematic diagram of the current during the reverse recovery process in the high power storage diode of the present invention.

An important factor in the design of the high power storage diode of the present invention is the base width which is predetermined by carefully controlling the depth of the boron and phosphorous diffusions. As was recognized by the prior art, as the base width is increased the reverse storage time increases. This characteristic is indicated in FIG. 2 which shows a trace of the current in a high power storage diode during switchover from forward to reverse current conditions; as shown, the storage phase is measured from the time that the current is reduced to zero to the time when the reverse current begins its abrupt decay back to zero. As the base width of the diode is increased, however, it has been found that the "droop" of the reverse current is increased. This droop is indicated in FIG. 2 by the dashed line which represents a typical tracing of the reverse current in a storage diode while the flat solid line represents the ideal reverse current condition. The droop is measured as a percentage of the maximum reverse current, and it is normally desired to keep this as low as possible so that the control of the storage time (which may be handled in the external circuitry) will bear a nearly linear relationship with the power delivered by the reverse current pulses. As is well known, the increase in base width also results in an increase in forward voltage drop. It has been found that at base widths below about 60 microns all electrical characteristics of the high power storage diode completely deteriorate. Consequently, it is felt that a base width of at least about 100 microns is necessary in any high power storage diode device.

A particularly important factor in any high power storage diode, as indeed in any high power diode, is the cross sectional area of the device. As the area of the device increases, the storage time increases while the forward voltage drop and the droop of the storage phase decrease. It is evident, therefore, that the maximum device area permissible should be adopted so as to utilize all three of these parameter improvements.

As pointed out hereinbefore, the first step in preparing a silicon body for use as a high power storage diode is to diffuse atoms of phosphorous into one end surface thereof. This can be accomplished by placing the silicon body 10 in a furnace at approximately 1,250° C. while passing $POCl_3$ over the body in order to form a layer of heavily doped N-type material about the body. By varying the diffusion time and the temperature the concentration level and the depth of diffusion can be varied. It has surprisingly been found, by fixing all other parameters of the high power storage diode and varying only the concentration of the phosphorous in the N-layer, that the phosphorous concentration has a considerable effect upon the reverse storage characteristics of the device. This concentration is the average concentration of atoms in the diffused layer and it can be determined by measuring the sheet resistance at the surface of the layer and by measuring the depth of the layer. By using conventional and standard curves prepared for Gaussian distributions of dopant inclusions, the average concentration of atoms can be evaluated.

It has been discovered that as the phosphorous concentration is reduced, the reverse storage time increases but the droop of the storage phase increases. It has been established that a phosphorous concentration in the range of from about $2 \times 10^{20}$ to about $5 \times 10^{20}$ atoms per cubic centimeter is required to obtain a fairly long storage phase without undue droop. A concentration of $3.5 \times 10^{20}$ atoms/cm.$^3$ is the optimum level.

After the phosphorous diffusion, the silicon body is lapped off on one side to eliminate the N-layer. This side is then painted with boron trioxide ($B_2O_3$) while the remainder of the body is masked, and a second diffusion step is carried out in a nitrogen atmosphere in a furnace at about 1,300° C. By varying the diffusion time and the temperatures, the concentration of the boron and the diffusion depth can be controlled, and the average concentration level is measured in exactly the same manner as with the phosphorous diffusion.

It has been found that the boron concentration also is a significant factor in determining the reverse current characteristics. The boron concentration seems to be the main factor in determining the reverse voltage build-up time in the diode (see FIG. 2), and all concentrations of less than $2 \times 10^{20}$ atoms per cubic centimeter will result in a reverse recovery time in excess of one-tenth of a microsecond. At boron concentrations above $2 \times 10^{20}$ atoms/cm.$^3$, the reverse recovery time was one*enth of a microsecond or betterz This concen*tration is believed to be a generally critical level, and it is felt that at least this approximate boron concentration, or better, should be present in a good quality high power storage diode.

One further factor should be noted with regard to the boron concentration. With increasing concentrations, the "ringing" effect seems to increase following the reverse voltage build-up (see FIG. 2). If these damped oscillations are intolerable because of the nature of the circuitry in which the storage diode is placed, then the lower level boron concentrations should be used as near to $2 \times 10^{20}$ atoms/cm.$^3$ as possible.

One final discovery in connection with the design of the high power storage diode of the present invention was the discovery that the diffusion of nickel into the base of the diode for the purpose of improving the minority carrier lifetime had the effect of increasing the reverse storage time without otherwise degrading the other useful electrical characteristics of the device. In carrying out the nickel diffusion, the nickel was electroless plated onto one of the end faces of the diode subsequent to the phosphorous and boron diffusions. The plated diode was then heated in a furnace at a temperature of approximately 1,100° C. for periods of time ranging from 4 to 15 minutes. By comparing the results obtained by the nickel-diffused diodes with those obtained from diodes having the identical qualities except for the addition of nickel in the space charge region, it was found that a slight increase in reverse storage time resulted while the reverse recovery time and droop remained about the same.

As an example of a high power storage diode processed in accordance with the teachings of the present invention, a series of diodes were prepared having a cross sectional area of 0.146 square inches using a starting lightly doped P-type silicon crystal material of approximately 100 ohm-centimeters resistivity. A phosphorous diffusion was carried out to yield an average concentration of $3.5 \times 10^{20}$ atoms per cubic centimeter in the N-type end layer of the diode, and a boron diffusion was carried out to yield an average concentration of $4.2 \times 10^{20}$ atoms per cubic centimeter in the P+ end layer of the diode. The base width of the final device was determined to be around 110 microns. Using the standard tests, the forward voltage drop at 200 amps forward current (sinusoidal pulses) was found to be 0.97 volts while the reverse voltage rating was found to be (on the average) 1,300 volts. The average reverse storage time proved to be 3.5 microseconds with a maximum reverse current of around 50 amps, a recovery time of less than one-tenth of a microsecond, and with a droop of about 12 percent. When the cross sectional area was increased to 0.196 square inches with the rest of the characteristics remaining the same, the forward voltage dropped to 0.93 volts at 200 amps forward current while the storage time increased to 4.5 microseconds (at 50 amps reverse current) with a recovery time of less than one-tenth of a microsecond and with a droop of about 8 percent.

Although the best mode contemplated for carrying out the present invention has been herein shown and described, it will be apparent that modification and variation may be made without departing from what is regarded to be the subject matter of the invention.

What is claimed is:

1. A high power storage diode having a substantially constant reverse current phase followed by a rapid reverse voltage build-up time after switching from forward current to reverse current conditions, said diode comprising a silicon body having a lightly doped base region of P-type material enclosed within a first end layer of N-type material on one side of said base region and a second end layer of P-type material of a substantially higher doping concentration than that of said base region on the other side of said base region, said base region having a thickness of at least about 100 microns, said first end layer being formed by diffusing phosphorous into said silicon material so that the average concentration of phosphorous in said region is between about $2 \times 10^{20}$ atoms/cm.$^3$ and $5 \times 10^{20}$ atoms/cm.$^3$, and said second end layer being formed by diffusing boron into said silicon material so that the average concentration of boron in said region is greater than about $2 \times 10^{20}$ atoms/cm.$^3$.

2. A high power storage diode according to claim 1 wherein the average concentration of phosphorous in said first end layer is about $3\frac{1}{2} \times 10^{20}$ atoms/cm.$^3$.

3. A high power storage diode according to claim 1 wherein the average concentration of boron in said second end layer is about $2 \times 10^{20}$ atoms/cm.$^3$.

4. A high power storage diode according to claim 1 wherein the space charge region of said diode contains dopant inclusions of nickel for increasing the minority carrier lifetime therein.

5. In a process for making a high power storage diode having a substantially constant reverse current phase followed by a rapid reverse voltage build-up time after switching from forward current to reverse current conditions including the steps of providing a silicon body of lightly doped P-type material, diffusing phosphorus into one side of said body so as to form an end region having N-type conductivity and an average doping concentration of between about $2 \times 10^{20}$ atoms/cm.$^3$ and about $5 \times 10^{20}$ atoms/cm.$^3$, and diffusing boron into the opposite side of said body so as to form an end region having P-type conductivity and an average doping concentration of greater than about $2 \times 10^{20}$ atoms/cm.$^3$ whereby the base region of said silicon body between said end regions has a thickness of at least about 100 microns.

6. In a process for making a high power storage diode according to claim 5 including the further step of introducing nickel as a dopant into the space charge region of said diode for increasing the minority carrier lifetime therein.

7. In a process for making a high power storage diode according to claim 6 wherein said nickel is introduced into said silicon body by a diffusion process wherein nickel is first plated onto one of the end surfaces of the body after which the body is heated in a furnace for a predetermined period of time.

8. In a process for making a high power storage diode according to claim 7 wherein said nickel plated silicon body is placed in a furnace at approximately 1,100° C. for a period of at least 4 minutes.

* * * * *

UNITED STATES PATENT OFFICE
CERTIFICATE OF CORRECTION

Patent No. 3,710,203 Dated January 9, 1973

Inventor(s) Donald F. Stahr et al.

It is certified that error appears in the above-identified patent and that said Letters Patent are hereby corrected as shown below:

Column 5, line 2, after "one", leave a space and insert -- -t --; same line, after "better", cancel "Z" and insert a period -- . --.

Signed and sealed this 24th day of September 1974.

(SEAL)
Attest:

McCOY M. GIBSON JR.
Attesting Officer

C. MARSHALL DANN
Commissioner of Patents

FORM PO-1050 (10-69)

USCOMM-DC 60376-P69
* U.S. GOVERNMENT PRINTING OFFICE : 1969 O—366-334.